United States Patent
Kuo et al.

(10) Patent No.: US 10,797,023 B2
(45) Date of Patent: Oct. 6, 2020

(54) INTEGRATED FAN-OUT PACKAGE AND METHOD OF FABRICATING AN INTEGRATED FAN-OUT PACKAGE

(71) Applicant: Taiwan Semiconductor Manufacturing Co., Ltd., Hsinchu (TW)

(72) Inventors: Hung-Jui Kuo, Hsinchu (TW); Yu-Hsiang Hu, Hsinchu (TW); Sih-Hao Liao, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/594,089

(22) Filed: Oct. 7, 2019

(65) Prior Publication Data

US 2020/0035648 A1    Jan. 30, 2020

Related U.S. Application Data (62) Division of application No. 15/846,234, filed on Dec. 19, 2017, now Pat. No. 10,446,521.

(Continued)

(51) Int. Cl.
*H01L 23/48*      (2006.01)
*H01L 25/065*     (2006.01)
(Continued)

(52) U.S. Cl.
CPC .......... *H01L 25/0655* (2013.01); *H01L 21/56* (2013.01); *H01L 23/3121* (2013.01); *H01L 23/3135* (2013.01); *H01L 23/49816* (2013.01); *H01L 23/49822* (2013.01); *H01L 24/05* (2013.01); *H01L 24/19* (2013.01); *H01L 24/20* (2013.01); *H01L 23/5389* (2013.01); *H01L 2224/04105* (2013.01); *H01L 2224/05084* (2013.01); *H01L 2224/05111* (2013.01);
(Continued)

(58) Field of Classification Search
CPC .......... H01L 25/0655; H01L 23/49822; H01L 21/56; H01L 2224/05008
USPC ...................................................... 257/783
See application file for complete search history.

(56) References Cited

U.S. PATENT DOCUMENTS

| | | | |
|---|---|---|---|
| 6,437,450 B1 * | 8/2002 | Baba ...................... | H01L 21/563 257/778 |
| 6,798,072 B2 * | 9/2004 | Kajiwara .............. | H01L 21/563 257/778 |

(Continued)

*Primary Examiner* — Nitin Parekh
(74) *Attorney, Agent, or Firm* — JCIPRNET (57) ABSTRACT

A method of fabricating an INFO package may include at least the following steps. A first buffer pattern and a second buffer pattern are formed on a substrate. A first chip is attached on the substrate through the first buffer pattern. A second chip is attached on the substrate through the second buffer pattern. A squeezing force is provided between an exterior surface of the substrate and a top surface of the first chip and between an exterior surface of the substrate and a top surface of the second chip. The squeezed first buffer pattern and the squeezed second buffer pattern are cured. A molding compound is formed surrounding the first chip, the second chip, the squeezed first buffer pattern and the squeezed second buffer pattern. A redistribution circuit structure layer is formed electrically connected to the first chip and the second chip on the molding compound.

20 Claims, 10 Drawing Sheets

Related U.S. Application Data (60) Provisional application No. 62/582,318, filed on Nov. 7, 2017.

(51) Int. Cl.
  *H01L 23/498* (2006.01)
  *H01L 23/31* (2006.01)
  *H01L 23/00* (2006.01)
  *H01L 21/56* (2006.01)
  *H01L 23/538* (2006.01)

(52) U.S. Cl.
  CPC ............... *H01L 2224/05147* (2013.01); *H01L 2224/05155* (2013.01); *H01L 2224/12105* (2013.01); *H01L 2224/214* (2013.01); *H01L 2224/24137* (2013.01); *H01L 2224/32225* (2013.01); *H01L 2224/73267* (2013.01); *H01L 2224/83192* (2013.01); *H01L 2224/92244* (2013.01)

(56) References Cited

U.S. PATENT DOCUMENTS

| | | | |
|---|---|---|---|
| 6,975,035 B2 * | 12/2005 | Lee | H01L 21/563 257/737 |
| 7,161,237 B2 * | 1/2007 | Lee | H01L 23/13 257/673 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2012/0126395 A1 * | 5/2012 | Lee | H01L 23/3128 257/737 |
| 2016/0181218 A1 * | 6/2016 | Karhade | H01L 25/0657 257/737 |
| 2017/0125375 A1 * | 5/2017 | Chinnusamy | H01L 21/565 |

* cited by examiner

INTEGRATED FAN-OUT PACKAGE AND METHOD OF FABRICATING AN INTEGRATED FAN-OUT PACKAGE

CROSS-REFERENCE TO RELATED APPLICATION

This application is a divisional application of U.S. patent application Ser. No. 15/846,234, filed on Dec. 19, 2017, now allowed, and claims the priority benefit of U.S. provisional application Ser. No. 62/582,318, filed on Nov. 7, 2017. The entirety of the above-mentioned patent applications is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on. Currently, a technique of integrated fan-out (INFO) packages having more compactness is developed and utilized in various package applications.

For example, the INFO package may be utilized for packaging multiple chips. However, the more the chips the more difficult the INFO package fabrication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1:
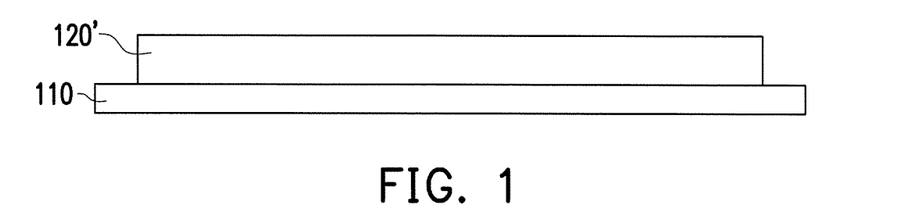
FIG. 1 to FIG. 16 schematically illustrate respective steps of fabricating an INFO package in accordance with some embodiments.

Referring to FIG. 1, a substrate 110 is provided and a buffer material layer 120' is formed on the substrate 110. The substrate 110 may have sufficient rigidity or stiffness for providing a solid stand for the subsequent process. The substrate 110 may be, but not limited to a glass substrate. The buffer material layer 120' may be made of a thermoplastic material, such as epoxy resin, phenol resin, or polyolefin. Alternatively, other thermoplastic materials or polymers compatible with semiconductor processing environments may be used to form the buffer material layer 120'. In some embodiments, the buffer material layer 120' may be a tape, e.g. a double side tape. The buffer material layer 120' may be formed on the substrate 110 by a lamination process or a spin coating process.

Figure 2:
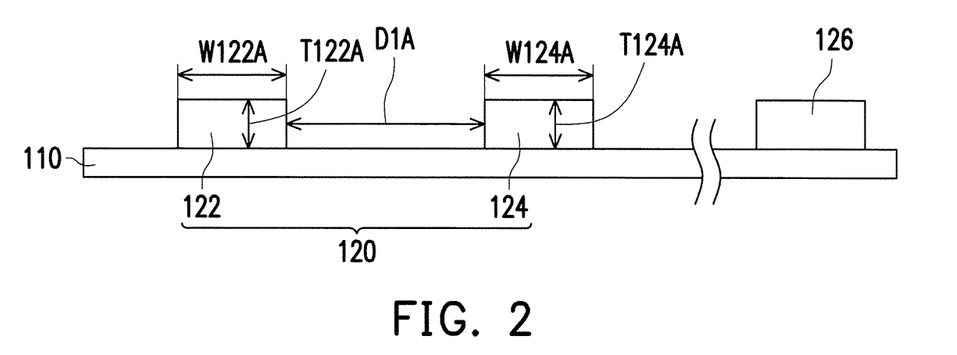

The buffer material layer 120' may be patterned to form the buffer layer 120 as shown in FIG. 2. The buffer layer 120 may include a first buffer pattern 122 and a second buffer pattern 124. The two buffer patterns are illustrated as an example, and in alternative embodiments, the buffer layer 120 may include more than two buffer patterns. The buffer layer 120 may be patterned by using lithography-etching process. The first buffer pattern 122 and the second buffer pattern 124 are patterned from the same layer (the buffer material layer 120' in FIG. 1) so that a thickness T122A of the first buffer pattern 122 and a thickness T124A of the second buffer pattern 124 may be substantially the same. In some alternative embodiments, the first buffer pattern 122 and the second buffer pattern 124 may be individually formed on the substrate 110 by using an attaching process, printing process or the like, such that the thickness T122A of the first buffer pattern 122 and the thickness T124A of the second buffer pattern 124 may be different. During forming the first buffer pattern 122 and the second buffer pattern 124, an alignment mark 126 formed on the substrate 110 may be used for ensuring the disposition locations of the first buffer pattern 122 and the second buffer pattern 124.

Figure 3:
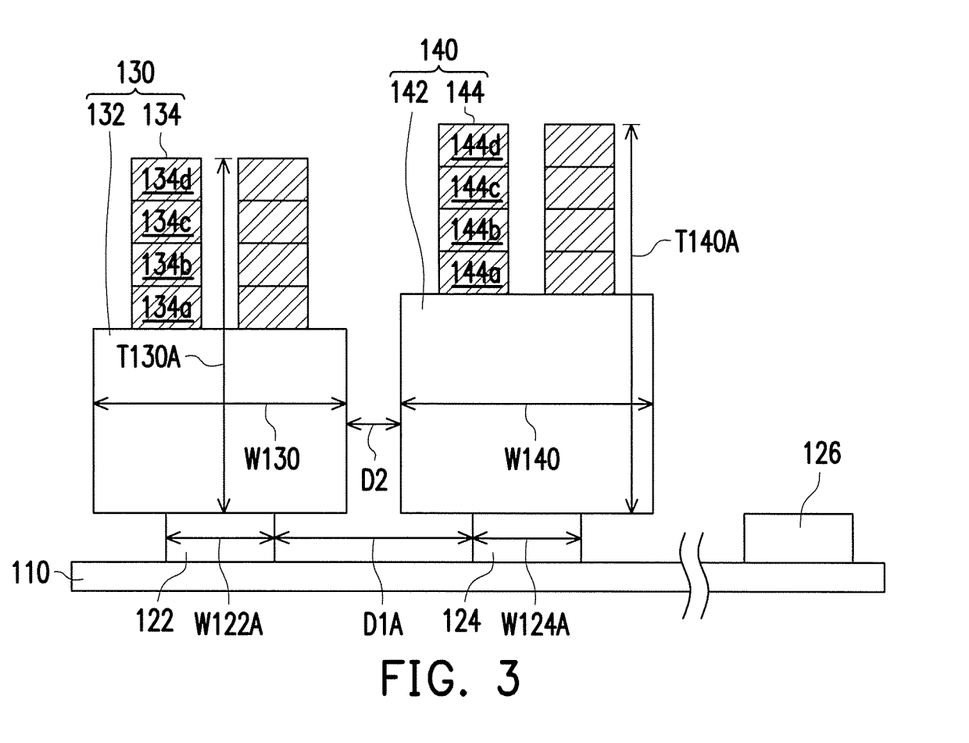

Subsequently, as shown in FIG. 3, a first chip 130 and a second chip 140 are attached on the substrate 110. The first chip 130 may be attached on the substrate 110 through the first buffer pattern 122 and the second chip 130 may be attached on the substrate 110 through the second buffer pattern 124. The position and the orientation of the first chip 130 and second chip 140 may be determined by using the alignment mark 126 as the alignment reference during the attaching. The first chip 130 may be positioned aligned with the first buffer pattern 122 and the second chip 140 may be positioned aligned with the second buffer pattern 124. The first chip 130 may include a chip portion 132 and a plurality of conductive pads 134. The conductive pads 134 are located at an active surface of the first chip 130. The conductive pads 134 and the first buffer pattern 122 are located at opposite sides of the chip portion 132. The second chip 140 may include a chip portion 142 and a plurality of conductive pads 144. The conductive pads 144 are located at an active surface of the second chip 140. The conductive pads 144 and the second buffer pattern 142 are located at opposite sides of the chip portion 142.

Each of the conductive pads 134 of the first chip 130 may include multiple conductive layers 134a-134d and each of the conductive pads 144 of the second chip 140 may include multiple conductive layers 144a-144d. The conductive layers 134a-134d are sequentially stacked on the chip portion 132, and two adjacent layers of the conductive layers 134a-134d may be made of different materials. For example, the conductive layers 134a-134d may respectively be made of Cu, Ni, Cu and Sn. Similarly, the conductive layers 144a-144d sequentially stacked on the chip portion 142 may be respectively be made of Cu, Ni, Cu and Sn. In other words, the conductive pads 134 and the conductive pads 144 may have similar or substantially the same structure.

The first chip 130 and the second chip 140 may provide different functions and are designed to be integrally packaged together. In some embodiments, the first chip 130 and the second chip 140 may respectively be a system on chip (SoC), a memory chip such as a high bandwidth memory chip, or other kinds of chip. The size of the chip portion 132 of the first chip 130 and the size of the chip portion 142 of the second chip 140 may not be the same. For example, a thickness T130A of the first chip 130 and a thickness T140A of the second chip 140 may be different, so that the first chip 130 and the second chip 140 may form a stagger structure on the substrate 110. In some embodiments, the conductive pads 134 and the conductive pads 144 may have similar thickness, such that the top surface 132S of the chip portion 132 of the first chip 130 and the top surface 142S of the chip portion 142 of the second chip 140 may located at various height levels in the thickness direction.

In some embodiments, a width W130 of the first chip 130 and a width W140 of the second chip 140 may be defined by the chip portion 132 and the chip portion 142, respectively. The disposition locations and the sizes of the first buffer pattern 122 and the second buffer pattern 124 are determined based on the disposition locations and the sizes of the first chip 130 and the second chip 140. The initial width W122A of the first buffer pattern 122 may be smaller than the width W130 of the first chip 130, and the initial width W124A of the second buffer pattern 124 may be smaller than the width W140 of the second chip 140. The distance D1A between the first buffer pattern 122 and the second buffer pattern 124 may be greater than the distance D2 between the first chip 130 and the second chip 140. In other words, an area of the first buffer pattern 122 is shrunk with respect to the first chip 130 and an area of the second buffer pattern 124 is shrunk with respect to the second chip 140.

Figure 4:
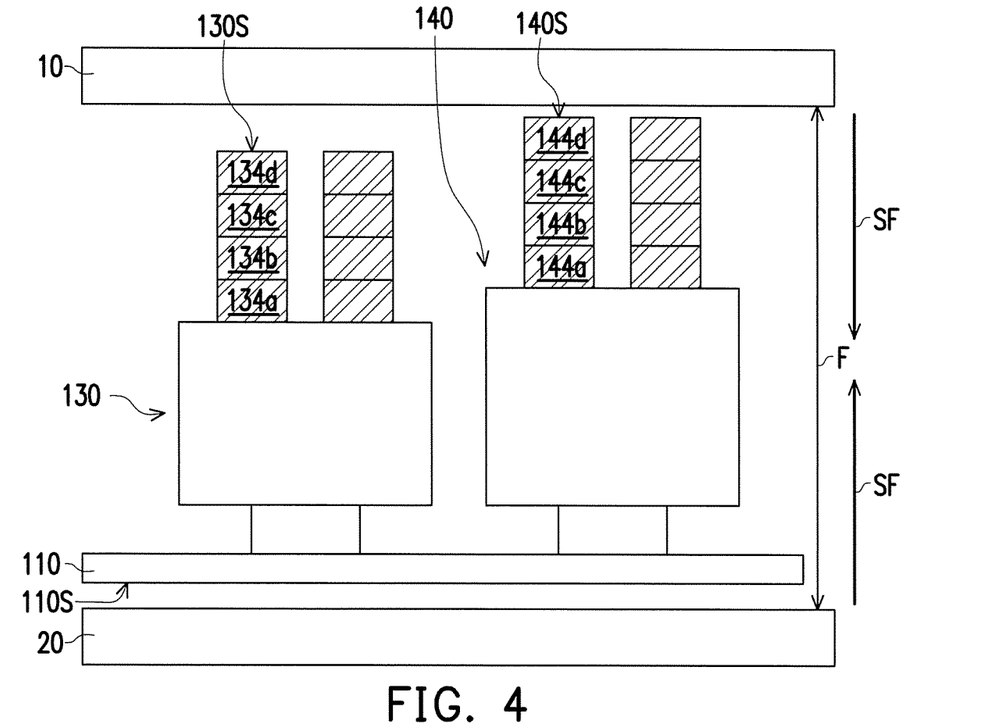

Subsequently, as shown in FIG. 4 in which the alignment mark 126 is omitted, a squeezing force SF is provided between the exterior surface 110S of the substrate 110 and the top surface 130S of the first chip 130 and between the exterior surface 110S of the substrate 110 and the top surface 140S of the second chip 140. In some embodiments, a pair of compression tools 10 and 20 having plate-like shape may be utilized to provide the squeezing force SF. For example, the substrate 110 with the first chip 130 and the second chip 140 attached thereon through the first buffer pattern 122 and the second buffer pattern 124 may be placed between the compression tool 10 and the compression tool 20. The compression tool 10 may be oriented in a manner parallel to the compression tool 20. A distance F between the compression tool 10 and the compression tool 20 may be reduced by moving at least one of the compression tool 10 and the compression tool 20 in the thickness direction so as to provide the squeezing force SF.

The compression tool 10 may lean against the thicker one of the first and the second chips 130 and 140 during the step of reducing the distance F. For example, during the squeezing, the compression tool 10 may firstly lean against the thicker second chip 140. After the compression tool 10 leaning against the second chip 140, the squeezing force SF is provided continuously, and the second buffer pattern 124 may be squeezed by the squeezing force SF. The squeezing force SF may be provided until the compression tool 10 further leans against the first chip 130 or the first buffer pattern 122 is squeezed. After the compression tool 10 leaning against the first and the second chips 130 and 140, the squeezing force SF may be stopped and the compression tools 10 and 20 may be removed.

Figure 5:
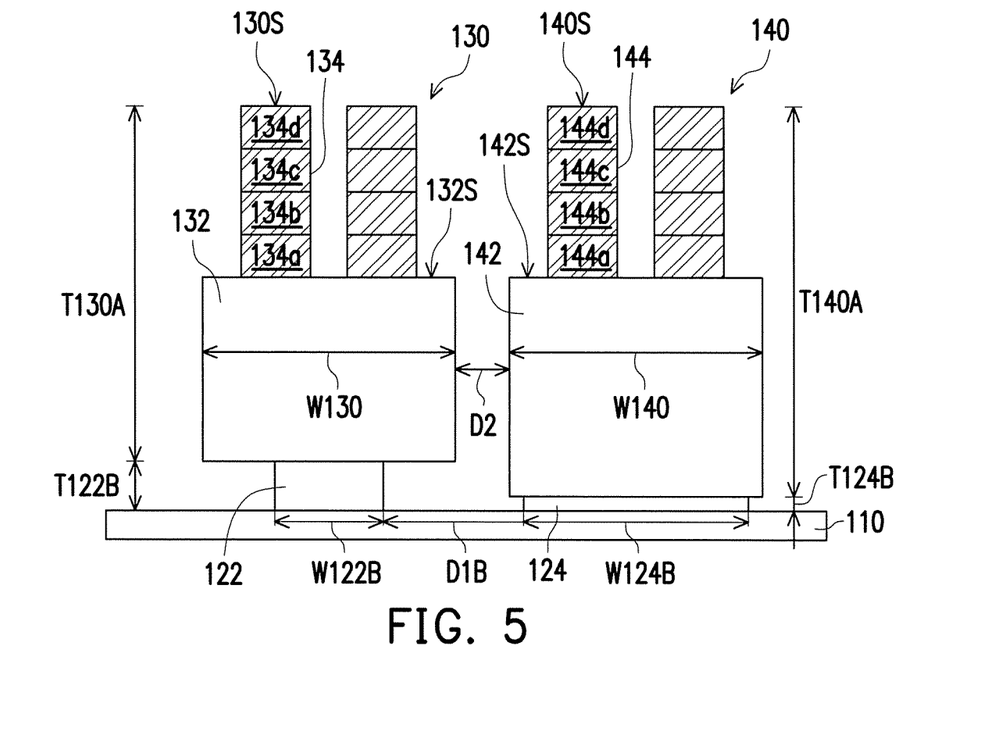

The first buffer pattern 122 and the second buffer pattern 124 are deformed under the squeezing force SF, and the squeezed first buffer pattern 122 and the squeezed second buffer pattern 124 are cured by performing a thermal curing process, a photo curing process, a combination thereof or the like. As shown in FIG. 5, at least one of the first buffer pattern 122 and the second buffer pattern 124 may be deformed after the squeezing while the sizes of the first chip 130 and the second chip 140 remain unchanged so that at least one of the thickness T122B of the first buffer pattern 122 and the thickness T124B of the second buffer pattern 124 may be smaller than their initial thicknesses and at least one of the width W122B of the first buffer pattern 122 and the width W124B of the second chip 124 may be greater than the initial widths.

In the case the thickness T130A of the first chip 130 smaller the thickness T140A of the second chip 140, the thickness T122B of the squeezed first buffer pattern 122 may be greater than the thickness T124B of the squeezed second buffer pattern 124. After the squeezing, a sum of the thickness T130A and the thickness T122B may be proximate or identical to a sum of the thickness T140A and the thickness T124B. In addition, the distance D1B between the squeezed first buffer pattern 122 and the squeezed second buffer pattern 124 may be smaller than the distance D1A between the initial first buffer pattern 122 and the initial second buffer pattern 124. In some embodiments, the distance D1B between the squeezed first buffer pattern 122 and the squeezed second buffer pattern 124 may be larger than the distance D2 between the first chip 130 and the second chip 140. In some alternative embodiments, the distance D1B between the squeezed first buffer pattern 122 and the squeezed second buffer pattern 124 may be substantially equal to or smaller than the distance D2 between the first chip 130 and the second chip 140.

The distance D1B between the squeezed first buffer pattern 122 and the squeezed second buffer pattern 124 may prevent the squeezed first buffer pattern 122 and the squeezed second buffer pattern 124 from contacting each other. Accordingly, at the step of FIG. 3, the initial sizes of the first buffer pattern 122 and the second buffer pattern 124 and the distance D1A between the first buffer pattern 122 and the second buffer pattern 124 may be determined based on the sizes and the relative positions of the first chip 130 and the second chip 140 such as the widths W130 and W140 and the distance D2. In some embodiment, the buffer pattern may be design to have a size smaller than the chip that is to-be attached thereon and the larger the chip size the larger the buffer pattern size. The size variation between the buffer pattern and the corresponding chip that is to-be attached thereon may be determined based on the height variation between the multiple chips that are to-be encapsulated as an integral. In some embodiments, the larger the height variation between the multiple chips that are to-be encapsulated as an integral the larger the size variation between the buffer pattern and the corresponding chip. In some embodiments, in addition to the co-planar configuration of the top surface 130A of the first chip 130 and the top surface 140S of the second chip 140, after the squeezing, the top surface 132S of the chip portion 132 and the top surface 142S of the chip portion 142 may be positioned at a substantial the same level.

Figure 6:
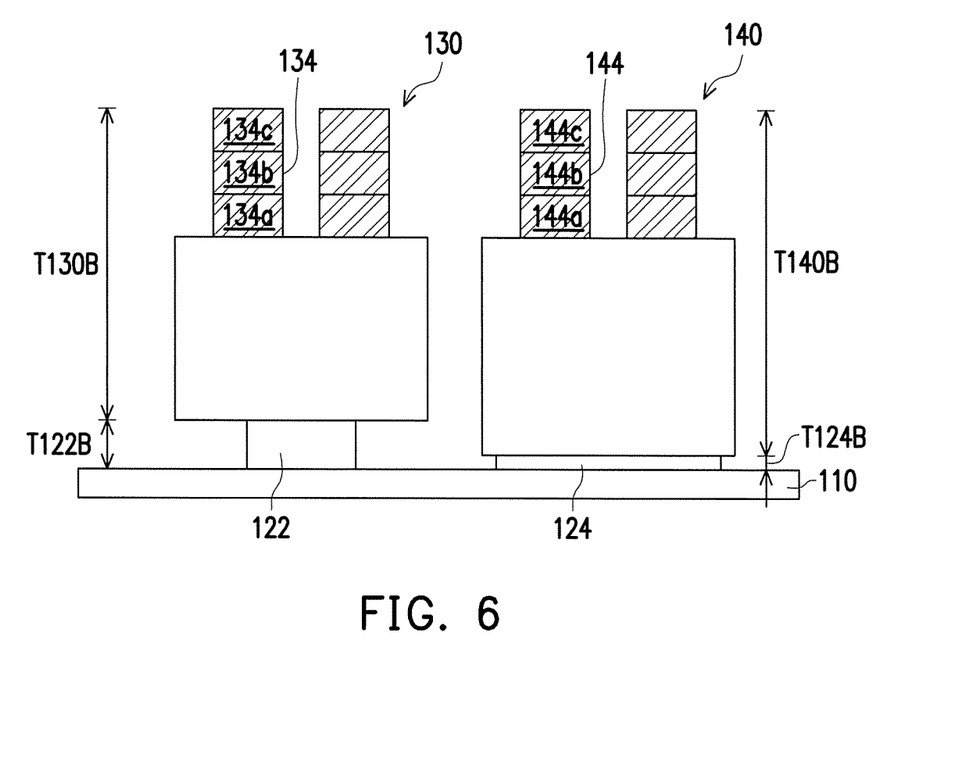

In some embodiments, the outermost conductive layers 134d and 144d are removed by performing an etching process and the etching process may be performed until the conductive layers 134c and 144c are exposed as shown in FIG. 6. As such, the first chip 130 may have the thickness T130B and the second chip 140 may have the thickness T140B. In some embodiments, a sum of the thickness T130B and the thickness T122B may be substantially the same as a sum of the thickness T140B and the thickness T124B.

Figure 7:
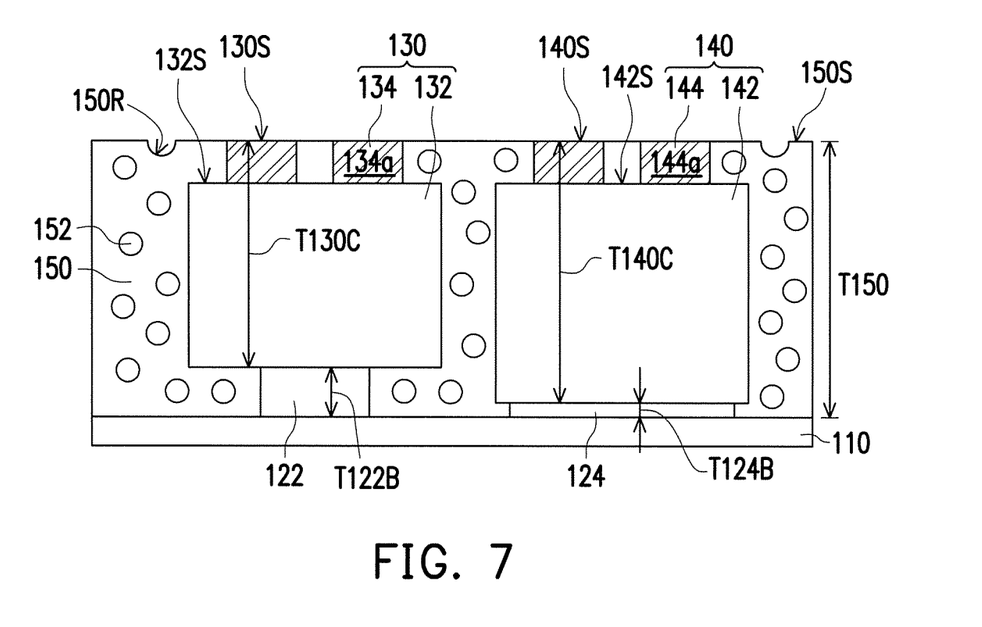

Subsequent to removing the outermost conductive layers 134d and 144d, a molding compound 150 is formed on the substrate 110 to encapsulate the first chip 130 and the second chip 140 as an integral as shown in FIG. 7. A material of the molding compound 150 may be a resin capable of being cured through a thermal cure process or photo cure process. In addition, the molding compound 150 may include the fillers 152 doped therein. The fillers 152 may be spherical or angular particles, may have a nanoscale size, and may be made of silica, metal oxide, glass fiber, or the like. A planarization process may be further performed after the molding compound 150 is formed on the substrate 110 so that the top surface 150S of the molding compound 150 is co-planar with the top surface 130S of the first chip 130 and the top surface 140S of the second chip 140. In some embodiments, the planarization process includes a Chemical-Mechanical Planarization (CMP), a grinding-polishing process or the like.

The planarization process may be performed to thin the molding compound 150 and the conductive pads 134 and 144 until the conductive layer 134a and the conductive layer 144a are exposed. By the structure that the first buffer pattern 122 and the second buffer pattern 124 have different thicknesses, the top surface 132S of the chip portion 132 and the top surface 142 of the chip portion 142 are substantially located at the same height level, such that the planarization process may have a good yield rate. For example, if the top surfaces of the chip portions are located at different height levels, an over grinding phenomenon may occur at the chip having the top surface of the chip portion located at higher level and/or an under grinding phenomenon may occur at the chip having the top surface of the chip portion located at lower level. Therefore, the over grinding phenomenon and the under grinding phenomenon may be prevented by the configuration of the top surfaces 132 and 142 of the chip portions 132 and 142 located at the substantially same height level. In addition, during the planarization process, the molding compound 150 may be partially grinded and a portion of the fillers 152 doped in the molding compound 150 may also be removed from the top surface, so that the molding compound 150 may have at least one recess 150R that is concaved from the top surface 150S of the molding compound 150.

As shown in FIG. 7, the molding compound 150 may surround and encapsulate the chip portion 132 and the conductive pads 134 of the first chip 130 and the chip portion 142 and the conductive pads 144 of the second chip 140. A sum of the thickness T130C of the first chip 130 and the thickness T122B of the first buffer pattern 122 and a sum of the thickness T140C of the second chip 140 and the thickness T124B of the second buffer pattern 124 may be substantially identical to the thickness T150 of the molding compound 150. In addition, the top surface 130S, the top surface 140S and the top surface 150S are coplanar.

Figure 8:
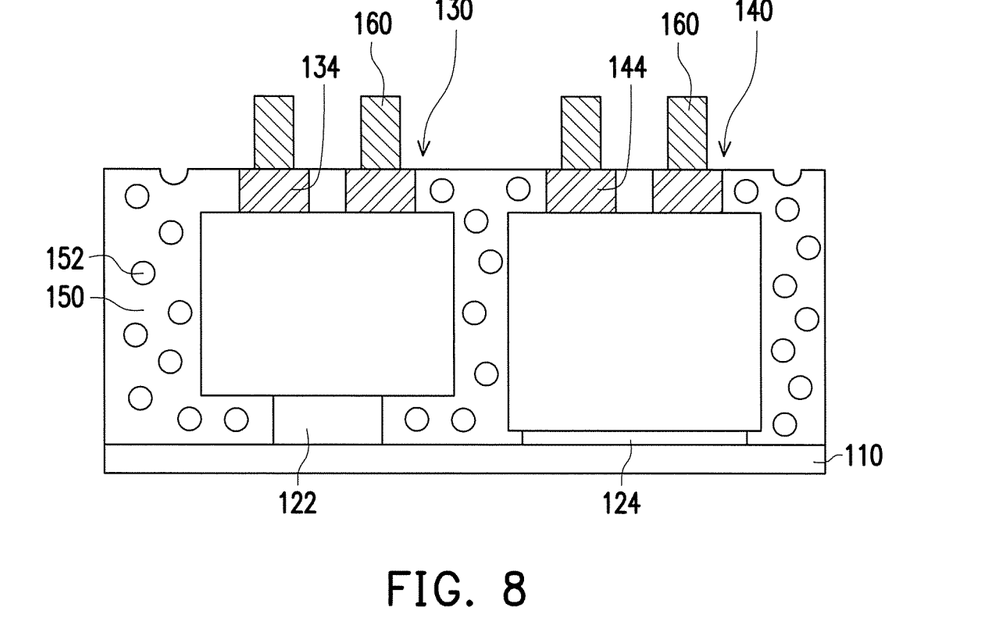

In FIG. 8, a plurality of conductive vias 160 are formed on the conductive pads 134 of the first chip 130 and the conductive pads 144 of the second chip 140, respectively. In some embodiments, the conductive vias 160 may be fabricated by the following process. A patterned layer (not shown) having openings is formed on the molding compound 150, and the openings of the patterned layer may expose the conductive pads 134 of the first chip 130 and the conductive pads 144 of the second chip 140, respectively. Subsequently, a conductive material fills into the openings of the pattern layer to form the conductive vias 160 by chemical vapor deposition (CVD), physical vapor deposition (PVD), atomic layer deposition (ALD), high density plasma CVD (HDPCVD), plating, other suitable methods, and/or combinations thereof. The conductive material includes, for example, titanium, tungsten, aluminum, copper, metal alloys, metal silicide, other suitable materials, and/or combinations thereof. The pattern layer is removed after the conductive vias 160 are formed.

Figure 9:
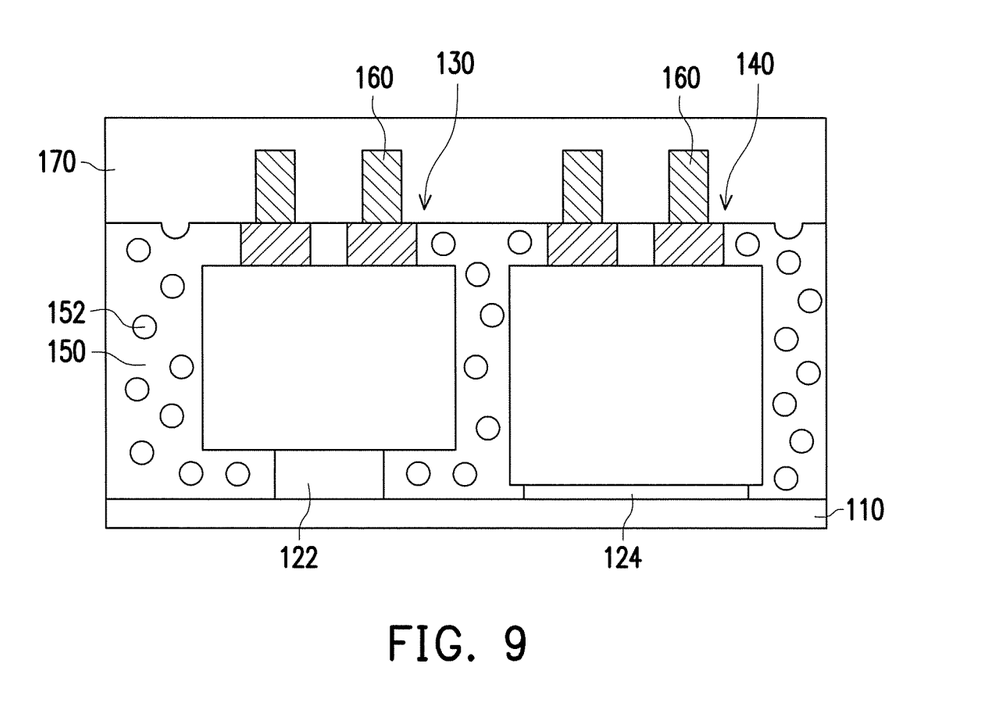
Figure 10:
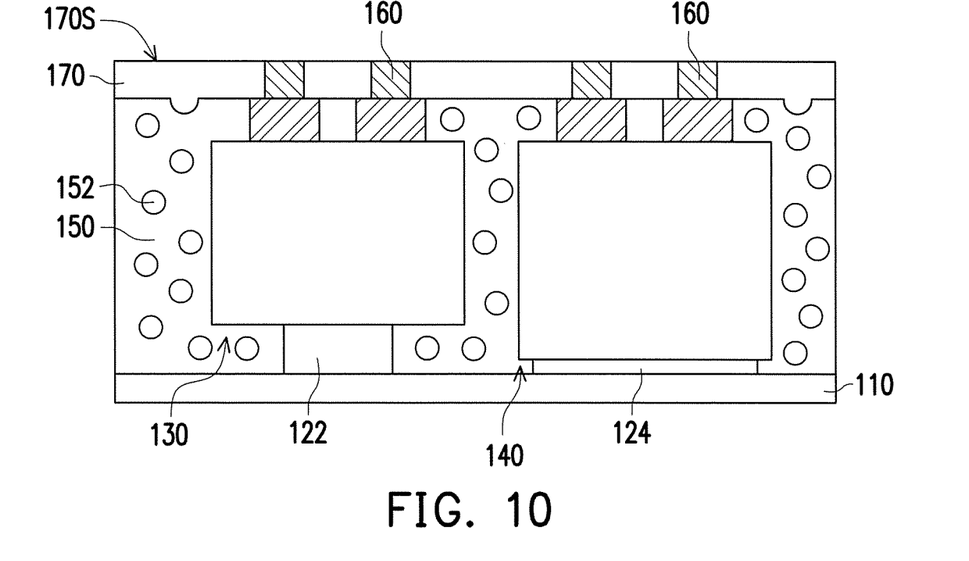

After forming the conductive vias 160, a coating layer 170 may be formed on the molding compound 150 to cover and encapsulate the conductive vias 160 as shown in FIG. 9. The coating layer 170 may be formed by performing a coating process, following by a curing process. A material of the coating layer 170 may be polyimide or other polymer material having insulating property. The coating layer 170 may have a thickness greater than the thickness of the conductive via 160 and a further planarization process may be performed to reduce the thickness of the coating layer 170 until the conductive vias 160 are exposed at the top surface 170S of the coating layer 170 as shown in FIG. 10. The conductive vias 160 penetrate through the coating layer 170.

Figure 11:
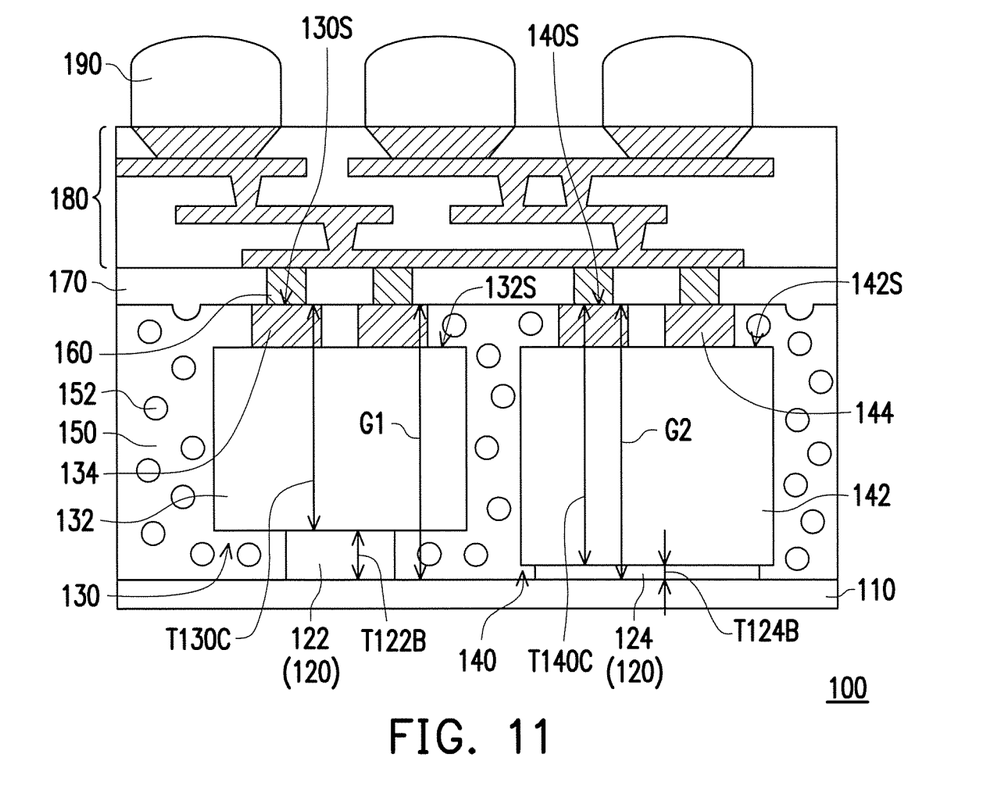

Thereafter, a redistribution circuit structure layer 180 may be formed on the coating layer 170 as shown in FIG. 11. In some embodiments, the redistribution circuit structure layer 180 may include at least one conductor such as conductive trace distributed in at least one layer of dielectric material. The conductive traces may provide a predetermined layout for mapping the required electrical conduction paths. In addition, the redistribution circuit structure layer 180 may be connected to the conductive vias 160 so that the first chip 130 and the second chip 140 may be electrically connected to the redistribution circuit structure layer 180 through the conductive vias 170. The first chip 130 and the second chip 140 may be electrically connected to one another through the conductive traces in the redistribution circuit structure layer 180. In addition, a plurality of conductive bumps 190 may be formed on the redistribution circuit structure layer 180 for bonding to an external component such as a circuit board. The conductive bumps 180 may be controlled collapsing chip connectors ("C4"), solder bumps, or other connectors for connecting to an external device.

In FIG. 11, an integrated fan out (INFO) package 100 may include the substrate 110, the buffer layer 120, the first chip 130, the second chip 140, the molding compound 150, the conductive vias 160, the coating layer 170, the redistribution circuit structure layer 180 and the conductive bumps 190. The first chip 130 and the second chip 140 are attached on the substrate 110 through the first buffer pattern 122 and the second buffer pattern 124 of the buffer layer 120, respectively. The molding compound 150 is disposed on the substrate 110 to surround and encapsulate the first chip 130 and the second chip 140 as well as the first buffer pattern 122 and the second buffer pattern 124. The redistribution circuit structure layer 180 may be disposed on the molding compound 150. The conductive vias 160 penetrating through the coating layer 170 are formed between the redistribution circuit structure layer 180 to electrically connect the first chip 130 and the second chip 140 to the redistribution circuit structure layer 180. The conductive bumps 190 are disposed at an exterior surface of the redistribution circuit structure layer 180 and electrically connected to the first chip 130 and the second chip 140 through the redistribution circuit structure layer 180 and the conductive vias 160.

The first chip 130 may include the chip portion 132 and the conductive pads 134 disposed at the top surface 132S of the chip portion 132. The second chip 140 may include the chip portion 142 and the conductive pads 144 disposed at the top surface 142S of the chip portion 142. The chip portion 132 of the first chip 130 and the chip portion 142 of the second chip 140 may have different size, e.g. different thicknesses. The thickness T130C of the first chip 130 is smaller than the thickness T140C of the second chip 140. The thickness T122B of the first buffer pattern 122 may be greater than the thickness T124B of the second buffer pattern 124. By the various thicknesses of the first buffer pattern 122 and the second buffer pattern 124, the top surface 132S of the chip portion 130 and the top surface 142S of the chip portion 140 are substantially positioned at the same height level. In addition, the distance G1 exists between the top surface 130S of the first chip 130 and the substrate 110, the distance G2 exists between the top surface 140S of the second chip 140 and the substrate 110, and a variation between the thickness T130C and the thickness T140C is greater than a variation between the distance G1 and the distance G2.

Figure 12:
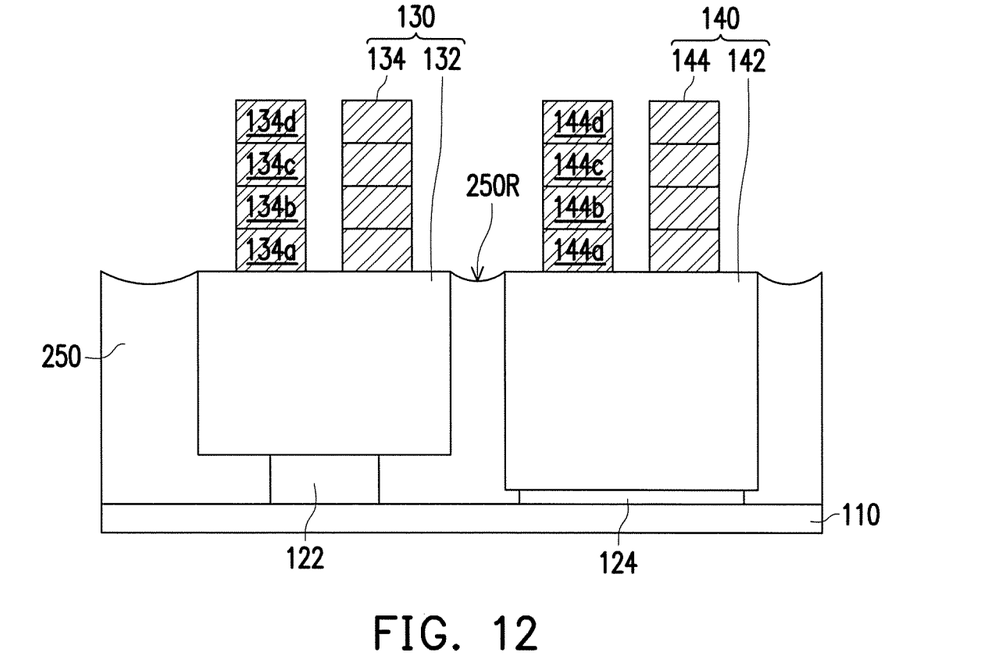

In some alternative embodiments, the step of FIG. 5 can be followed by the step of FIG. 12. In FIG. 12, a molding compound 250 is formed on the substrate 110 to encapsulate the chip portion 132 of the first chip 130 and the chip portion 142 of the second chip 140. The conductive pads 134 of the first chip 130 and the conductive pads 144 of the second chip 140 may be exposed by and protruded from the molding compound 250. The formation of the molding compound 250 may include the following steps. The conductive pads 134 and the conductive pads 144 may be attached to a flexible film (not shown). The flexible film may cover the sidewalls and the top of the conductive pads 134 and 144 in a conformal manner so that the chip portion 132 and the chip portion 142 are located between the substrate 110 and the flexible film. Subsequently, the material of the molding compound 250 may fill into the space between the substrate 110 and the flexible film from the lateral side until the material of the molding compound 250 surrounds and encapsulates the chip portion 132 and the chip portion 134. The material of the molding compound 250 surrounding and encapsulating the chip portion 132 and the chip portion 134 may be cured and the flexible film may be removed to form the molding compound 250. The material of the molding compound 250 may be a resin capable of being cured through a thermal cure process or photo cure process. The molding compound 250 may include a plurality of fillers (not shown) doped therein. In addition, the molding compound 250 may have a meniscus 250R between the chip portion 132 of the first chip 130 and the chip portion 142 of the second chip 140.

Figure 13:
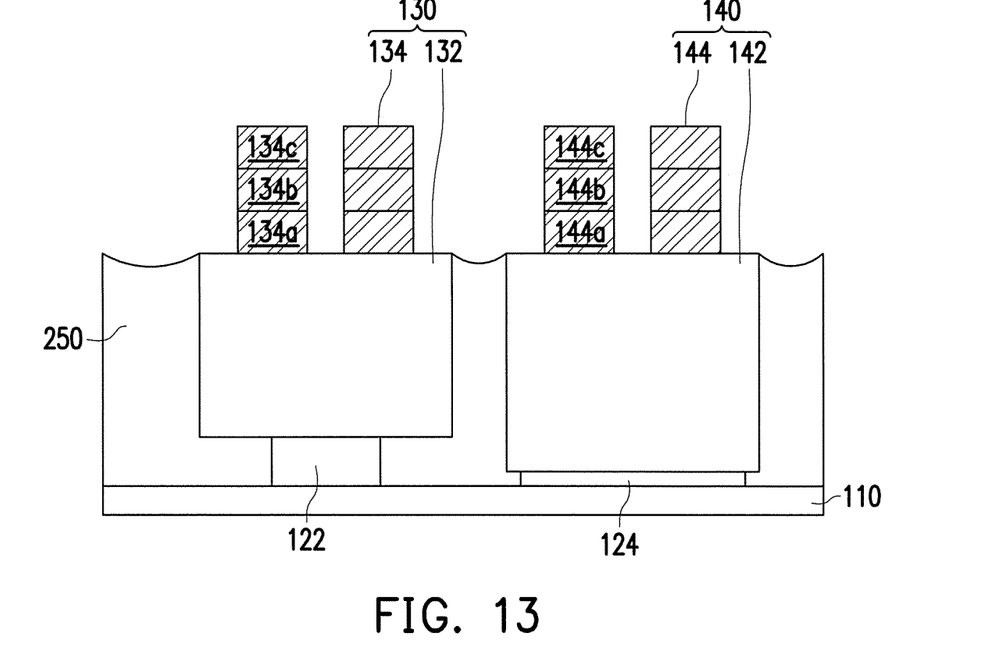

In some embodiments, each of the conductive pads 134 of the first chip 130 may include multiple conductive layers 134a-134d and each of the conductive pads 144 of the second chip 140 may include multiple conductive layers 144a-144d. The conductive layers 134a-134d are sequentially stacked on the chip portion 132, and two adjacent layers of the conductive layers 134a-134d may be made of different materials. For example, the conductive layers 134a-134d may respectively be made of Cu, Ni, Cu and Sn. Similarly, the conductive layers 144a-144d sequentially stacked on the chip portion 142 may be respectively be made of Cu, Ni, Cu and Sn. In other words, the conductive pads 134 and the conductive pads 144 may have similar or substantially the same structure. The outermost conductive layers 134d and 144d are removed by performing an etching process after the formation of the molding compound 250 and the etching process may be performed until the conductive layers 134c and 144c are exposed as shown in FIG. 13.

Figure 14:
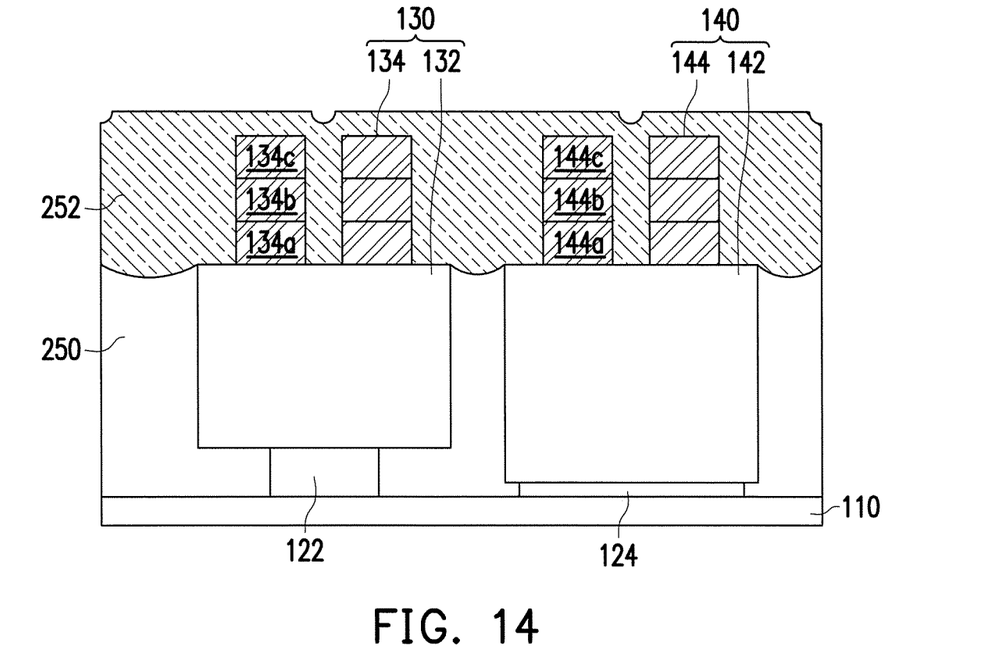
Figure 15:
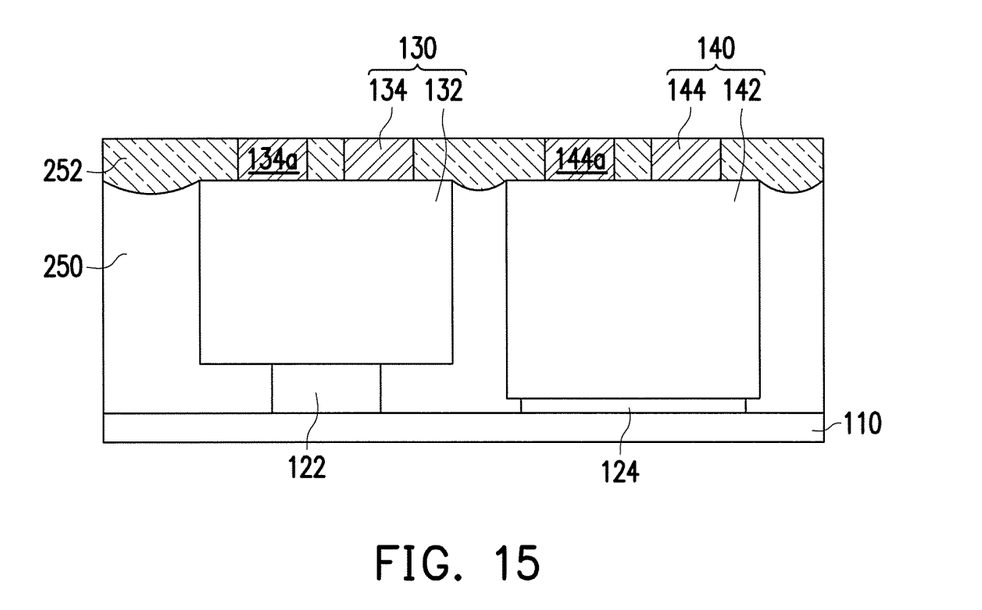

Subsequently, as shown in FIG. 14, a planarization layer 252 may be formed on the molding compound 250 to surround and encapsulate the conductive pads 134 and 144 as shown in FIG. 14. The planarization layer 252 may be formed by performing a coating process, following by a curing process. A material of the planarization layer 252 may be polyimide or other polymer material having insulating property. The planarization layer 252 along with the molding compound 250 may encapsulate the first chip 130 and the second chip 140 completely. The planarization layer 252 may have a thickness greater than the thicknesses of the conductive pads 134 or 144 and a planarization process may be performed to reduce the thickness of the planarization layer 252 until the conductive pads 134 or 144 are exposed as shown in FIG. 15. In some embodiments, the conductive layers 134b and 134c of the conductive pad 134 and the conductive layers 144b and 144c of the second conductive pad 144 are removed in the planarization process so that the conductive layer 134a of the conductive pad 134 and the conductive layer 144a of the conductive pad 144 are exposed in FIG. 15. Subsequent to the formation of the planarization layer 252, the steps of FIGS. 8-11 may be performed to form the INFO package 200 shown in FIG. 16.

Figure 16:
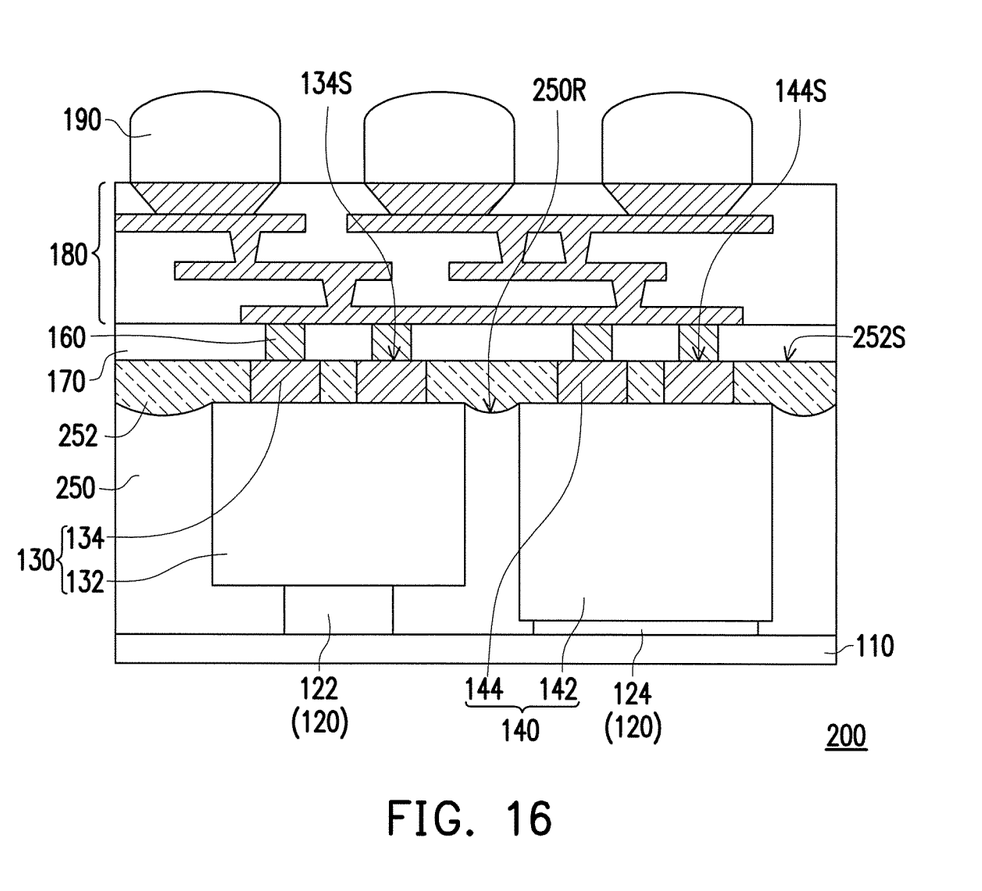

In FIG. 16, the INFO package 200 may include the substrate 110, the buffer layer 120, the first chip 130, the second chip 140, the molding compound 250, the planarization layer 252, the conductive vias 160, the coating layer 170, the redistribution circuit structure layer 180 and the conductive bumps 190. The substrate 110, the buffer layer 120, the first chip 130, the second chip 140, the conductive vias 160, the coating layer 170, the redistribution circuit structure layer 180 and the conductive bumps 190 may have similar structure and material as the substrate 110, the buffer layer 120, the first chip 130, the second chip 140, the conductive vias 160, the coating layer 170, the redistribution circuit structure layer 180 and the conductive bumps 190 of the INFO package 100. The molding compound 250 may surround and encapsulate the chip portion 132 of the first chip 130 and the chip portion 142 of the second chip 140 as an integral. The conductive pads 134 of the first chip 130 are not encapsulated by the molding compound 250 and are protruded from the top surface of the molding compound 250. The planarization layer 252 is disposed on the molding compound 250 and located between the molding compound 250 and the redistribution circuit structure layer 180 to surround and encapsulate the conductive pads 134 and 144.

The top surface 252S of the planarization layer 252 is substantially coplanar to respective top surfaces 134S and 144S of the conductive pads 134 and 144. In some embodiments, the molding compound 250 may have the meniscus 250R between the first chip 130 and the second chip 140.

Figure 17:
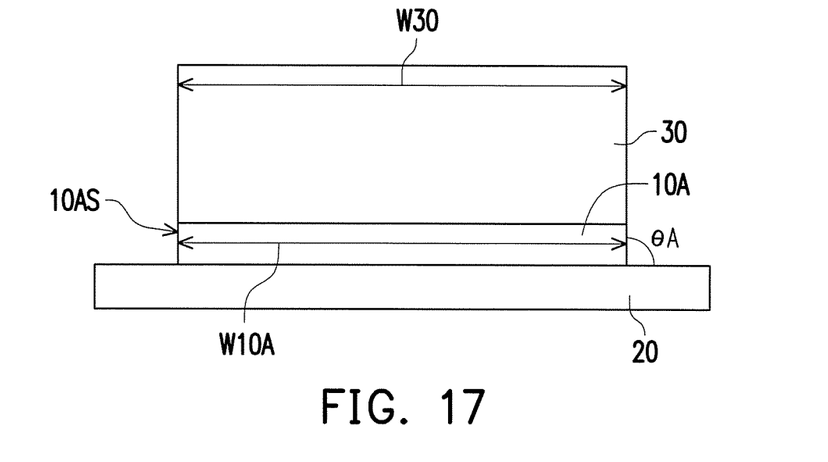
FIG. 17 to FIG. 22 schematically illustrate various embodiments of a buffer pattern disposed between a substrate and a chip in accordance with some embodiments.

In some embodiments, the buffer patterns (122 or 124) formed between the chip (130 or 140) and the substrate 110 may have various shapes and FIG. 17 to FIG. 22 schematically illustrate some embodiments of the shapes of the buffer pattern. As shown in FIG. 17, a buffer pattern 10A is disposed between a substrate 20 and a chip 30. In the embodiment, the width W10A of the buffer pattern 10A may be constant and the buffer pattern 10A has a sidewall 10AS that is substantially vertical to the substrate 20. The exterior angle θA formed by the sidewall 10AS and the substrate 20 may be around 90 degrees. In some embodiments, the width W10A of the buffer pattern 10A may be substantially the same as the width W30 of the chip 30, but the width W10A and the width W30 may be different in some alternative embodiments.

Figure 18:
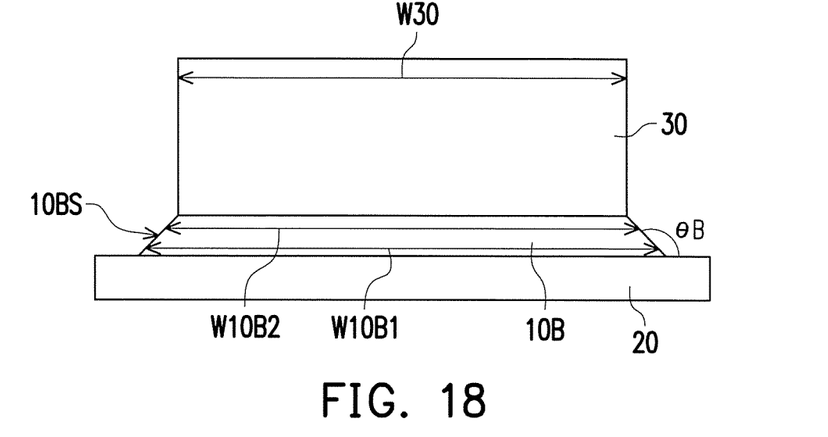

In FIG. 18, a buffer pattern 10B is disposed between a substrate 20 and a chip 30. In the embodiment, the width of the buffer pattern 10B may be various from the substrate 20 to the chip 30. The width of the buffer pattern 10B is gradually reduced from a side adjacent to the substrate 20 to an opposite side adjacent to the chip 30. For example, the buffer pattern 10B may have a larger width W10B1 at the height level adjacent to the substrate 20 and have a smaller width W10B2 at the height level adjacent to the chip 30. The buffer pattern 10B has sidewall 10BS that is oblique with respect to the substrate 20. The sidewall 10BS may be a straight linear sidewall and the exterior angle θB formed by the sidewall 10BS and the substrate 20 may be about around degrees to 120 degrees. In some embodiments, the smallest width of the buffer pattern 10B may be substantially the same as the width W30 of the chip 30, but the smallest width of the buffer pattern 10B and the width W30 may be different in some alternative embodiments.

Figure 19:
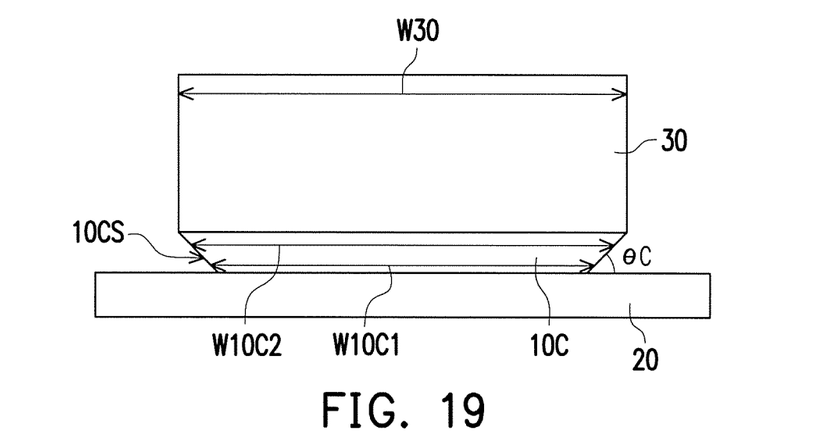

In FIG. 19, a buffer pattern 10C is disposed between a substrate 20 and a chip 30. In the embodiment, the width of the buffer pattern 10C may be various from the substrate 20 to the chip 30. The width of the buffer pattern 10C is gradually increased from a side adjacent to the substrate 20 to an opposite side adjacent to the chip 30. The buffer pattern 10C may have a smaller width W10C1 at the height level adjacent to the substrate 20 and have a larger width W10C2 at the height level adjacent to the chip 30. The buffer pattern 10C has sidewall 10CS that is oblique with respect to the substrate 20. The sidewall 10CS may be a straight linear sidewall and the exterior angle θC formed by the sidewall 10CS and the substrate 20 may be about 60 degrees to 90 degrees. In some embodiment, the largest width of the buffer pattern 10A may be substantially the same as the width W30 of the chip 30, but the largest width of the buffer pattern 10C and the width W30 of the chip 30 may be different in some alternative embodiments.

Figure 20:
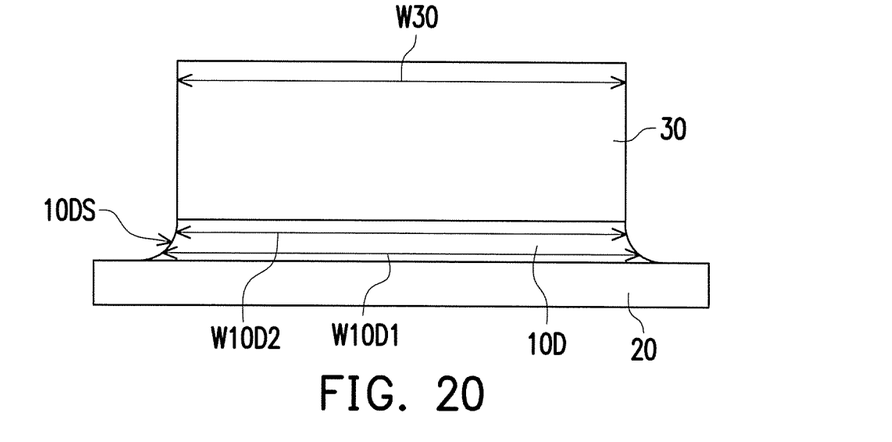

In FIG. 20, a buffer pattern 10D is disposed between a substrate 20 and a chip 30. In the embodiment, the width of the buffer pattern 10D may be various from the substrate 20 to the chip 30. The width of the buffer pattern 10D is gradually reduced from a side adjacent to the substrate 20 to an opposite side adjacent to the chip 30 in various gradients. The sidewall 10DS of the buffer pattern 10D is a curved sidewall. In the embodiment, the buffer pattern 10D has a larger width W10D1 at the height level adjacent to the substrate 10 and a smaller width W10D2 at the height level adjacent to the chip 30. The smallest width of the buffer pattern 10D may be smaller than the width W30 of the chip 30, and may alternatively be greater than or substantially the same as the width W30 of the chip 30.

Figure 21:
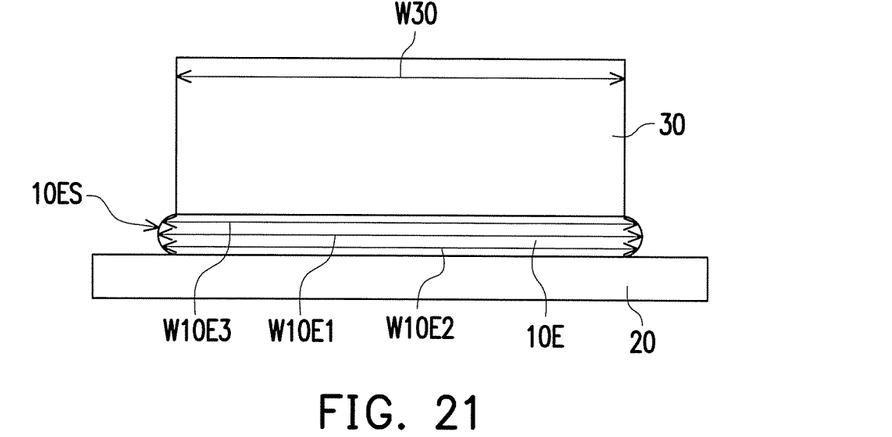

In FIG. 21, a buffer pattern 10E is disposed between a substrate 20 and a chip 30. In the embodiment, the width of the buffer pattern 10E may be various from the substrate 20 to the chip 30. The width of the buffer pattern 10E is gradually increased and subsequently gradually reduced from a side adjacent to the substrate 20 to an opposite side adjacent to the chip 30. The sidewall 10ES of the buffer pattern 10E is a curved sidewall. In the embodiment, the buffer pattern 10E has a largest width W10E1 at the middle portion so that the width W10E2 at the height level adjacent to the substrate 10 and the width W10E3 at the height level adjacent to the chip 30 are smaller than the width W10E1 at the middle portion. The width W10E3 may be or may be not that same as the width W10E2. The width W10E3 may be smaller than the width W30 of the chip 30. In some alternative embodiments, the width W10E3 may be greater than or substantially the same as the width W30 of the chip 30.

Figure 22:
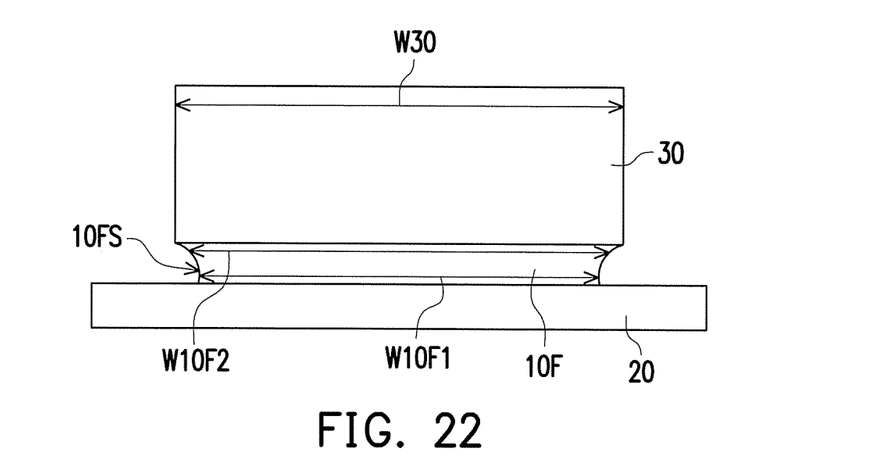

In FIG. 22, a buffer pattern 10F is disposed between a substrate 20 and a chip 30. In the embodiment, the width of the buffer pattern 10F may be various from the substrate 20 to the chip 30. The width of the buffer pattern 10F is gradually increased from a side adjacent to the substrate 20 to an opposite side adjacent to the chip 30 in a various reducing rate. The sidewall 10FS of the buffer pattern 10F is a curved sidewall. In the embodiment, the buffer pattern 10F has a smaller width W10F1 at the height level adjacent to the substrate 20 and a larger width W10F2 at the height level adjacent to the chip 30. The largest width of the buffer pattern 10F may be substantially the same as the width W30 of the chip 30. In some alternative embodiments, the largest width of the buffer pattern 10F may be greater or smaller than the width W30 of the chip 30. The first buffer pattern 122 illustrated in the previous embodiments may have the structure selected from one or a combination of the buffer patterns 10A to 10F in FIGS. 17 to 22. Similarly, the second buffer pattern 124 illustrated in the previous embodiments may have the structure selected from one or a combination of the buffer patterns 10A to 10F in FIGS. 17 to 22.

In accordance with some embodiments of the present disclosure, a method of fabricating an INFO package may include the following steps. A first buffer pattern and a second buffer pattern are formed on a substrate. A first chip is attached on the substrate through the first buffer pattern. A second chip is attached on the substrate through the second buffer pattern. A squeezing force is provided between an exterior surface of the substrate and a top surface of the first chip and between an exterior surface of the substrate and a top surface of the second chip. The squeezed first buffer pattern and the squeezed second buffer pattern are cured. A molding compound is formed surrounding the first chip, the second chip, the squeezed first buffer pattern and the squeezed second buffer pattern. A redistribution circuit structure layer is formed electrically connected to the first chip and the second chip on the molding compound.

In accordance with some embodiments of the present disclosure, a method of fabricating an INFO package may include the following steps. A first buffer pattern and a second buffer pattern are provided on a substrate. A first chip is disposed on the first buffer pattern and a second chip is disposed on the second buffer pattern. The first buffer pattern and the second buffer pattern are deformed to reduce the first distance to a second distance smaller than the first distance. The deformed first buffer pattern is separated from the deformed second buffer pattern by the second distance. The deformed first buffer pattern, the deformed second buffer pattern, the first chip and the second chip are encapsulated in a molding compound. A redistribution circuit structure layer is formed over the molding compound. The first chip and the second chip are electrically connected to the redistribution structure.

In accordance with some embodiments of the present disclosure, a method of fabricating an INFO package may include the following steps. A first chip is attached to a substrate through a first buffer pattern. An initial width of the first buffer pattern is smaller than the width of the first chip. A second chip is attached to the substrate through a second buffer pattern. The first buffer pattern is squeezed between the first chip and the substrate and the second buffer pattern is squeezed between the second chip and the substrate. The width of the squeezed first buffer pattern becomes greater than the initial width, and the first buffer pattern is reduced in thickness. A molding compound is formed on the substrate, surrounding the squeezed first buffer pattern, the squeezed second buffer pattern, the first chip and the second chip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an integrated fan-out (INFO) package, comprising:
    forming a first buffer pattern and a second buffer pattern on a substrate;
    attaching a first chip on the substrate through the first buffer pattern and attaching a second chip on the substrate through the second buffer pattern;
    providing a squeezing force between an exterior surface of the substrate and a top surface of the first chip and between the exterior surface of the substrate and a top surface of the second chip, wherein the exterior surface of the substrate is parallel to the top surface and a bottom surface of the first chip and to the top surface and a bottom surface of the second chip;
    curing the squeezed first buffer pattern and the squeezed second buffer pattern;
    forming a molding compound surrounding the first chip, the second chip, the squeezed first buffer pattern and the squeezed second buffer pattern after curing the squeezed first buffer pattern and the squeezed second buffer pattern; and
    forming a redistribution circuit structure layer electrically connected to the first chip and the second chip on the molding compound.

2. The method of claim 1, wherein the squeezing force is provided by placing the substrate, the first chip and the second chip between a first compression tool and a second compression tool and reducing a distance between the first compression tool and the second compression tool.

3. The method of claim 2, wherein the first compression tool and the second compression tool are arranged in parallel.

4. The method of claim 1, wherein at least one of a thickness of the first buffer pattern and a thickness of the second buffer pattern is reduced by the squeezing force.

5. The method of claim 1, further comprising reducing a thickness of the first chip and a thickness of the second chip by performing a planarization process after the first chip and the second chip are encapsulated by the molding compound.

6. The method of claim 5, further comprising forming a planarization layer on the molding compound, wherein the first chip includes a first conductive pad, the second chip includes a second conductive pad, and the planarization layer surrounds and encapsulate the first conductive pad and the second conductive pad.

7. The method of claim 6, wherein the planarization process is performed on the planarization layer.

8. A method of fabricating an INFO package, comprising:
    providing a first buffer pattern and a second buffer pattern on a substrate, the first buffer pattern and the second buffer pattern being separated by a first distance,
    disposing a first chip on the first buffer pattern and a second chip on the second buffer pattern,
    deforming the first buffer pattern and the second buffer pattern to reduce the first distance to a second distance smaller than the first distance, wherein the deformed first buffer pattern is separated from the deformed second buffer pattern by the second distance;
    encapsulating the deformed first buffer pattern, the deformed second buffer pattern, the first chip, and the second chip in a molding compound; and
    forming a redistribution circuit structure layer on the molding compound, wherein the first chip and the second chip are electrically connected to the redistribution circuit structure layer,
    wherein the first distance and the second distance are measured along a width direction of the first chip and the second chip.

9. The method of claim 8, wherein providing the first buffer pattern and the second buffer pattern comprises:
    forming a buffer layer on the substrate; and
    patterning the buffer layer.

10. The method of claim 9, wherein the first buffer pattern and the second buffer pattern have equal thicknesses, and the deformed first buffer pattern and the deformed second buffer pattern have different thicknesses.

11. The method of claim 8, wherein the first buffer pattern and the second buffer pattern are deformed by reducing respective gaps from the first chip and the second chip to the substrate.

12. The method of claim 8, wherein the first chip includes a first conductive pad on a top surface further away from the first buffer layer, the first conductive pad includes multiple conductive layers, and the method further comprises:
    removing a portion of the multiple conductive layers.

13. The method of claim 12, further comprising thinning the molding compound, wherein the portion of the multiple conductive layers is removed during thinning of the molding compound.

14. The method of claim 12, wherein the portion of the multiple conductive layers is removed before forming the molding compound.

15. A method of fabricating an INFO package, comprising:

attaching a first chip to a substrate through a first buffer pattern, wherein an initial width of the first buffer pattern is smaller than a width of the first chip;

attaching a second chip to the substrate through a second buffer pattern;

squeezing the first buffer pattern between the first chip and the substrate and the second buffer pattern between the second chip and the substrate, whereby the width of the squeezed first buffer pattern becomes greater than the initial width, and the first buffer pattern is reduced in thickness;

forming a molding compound on the substrate, surrounding the squeezed first buffer pattern, the squeezed second buffer pattern, the first chip and the second chip; and forming a redistribution circuit structure layer on the molding compound, wherein the first chip and the second chip are electrically connected to the redistribution circuit structure layer.

16. The method of claim 15, wherein the width of the squeezed first buffer pattern is smaller than the width of the first chip.

17. The method of claim 15, further comprising forming conductive vias on the first chip and the second chip before forming the redistribution circuit structure layer, wherein the conductive vias electrically connect the first chip and the second chip to the redistribution circuit structure layer.

18. The method of claim 17, further comprising forming a coating layer on the first chip and the second chip, wherein the coating layer encapsulates the conductive vias.

19. The method of claim 15, wherein the first chip includes a first contact pad having stacked conductive layers, and the method further comprises:

thinning the first contact pad until a bottommost conductive layer of the stacked conductive layers is exposed.

20. The method of claim 19, wherein a stacked conductive layer of the stacked conductive layers overlying the bottommost conductive layer is removed during a planarization process.

* * * * *